(12) United States Patent
Lindblad et al.

(10) Patent No.: US 9,431,363 B1
(45) Date of Patent: Aug. 30, 2016

(54) WIRE BONDED IC COMPONENTS TO ROUND WIRE

(71) Applicant: AUTOMATED ASSEMBLY CORPORATION, Lakeville, MN (US)

(72) Inventors: Scott Lindblad, Lakeville, MN (US); David Neuman, Randolph, MN (US); Robert Neuman, Cannon Falls, MN (US)

(73) Assignee: Automated Assembly Corporation, Lakeville, MN (US)

( * ) Notice: Subject to any disclaimer, the term of this patent is extended or adjusted under 35 U.S.C. 154(b) by 0 days.

(21) Appl. No.: 14/553,519

(22) Filed: Nov. 25, 2014

(51) Int. Cl.
*H01L 29/30* (2006.01)
*H01L 23/00* (2006.01)

(52) U.S. Cl.
CPC ............... *H01L 24/46* (2013.01); *H01L 24/85* (2013.01); *H01L 2224/494* (2013.01); *H01L 2224/4905* (2013.01); *H01L 2924/01013* (2013.01); *H01L 2924/01029* (2013.01); *H01L 2924/01079* (2013.01)

(58) Field of Classification Search
CPC .. H01L 24/46; H01L 24/85; H01L 29/66666

USPC .................................. 438/617; 257/679, 784
See application file for complete search history.

(56) References Cited

U.S. PATENT DOCUMENTS

| | | | | |
|---|---|---|---|---|
| 6,822,340 | B2* | 11/2004 | Lamson | H01L 23/4952 257/700 |
| 7,875,504 | B2* | 1/2011 | Silverbrook | H01L 21/56 438/118 |
| 2003/0122233 | A1* | 7/2003 | Yagi | G06K 19/07749 257/678 |
| 2005/0128086 | A1* | 6/2005 | Brown | G06K 19/07728 340/572.8 |
| 2009/0261444 | A1* | 10/2009 | Yamazaki | H01L 23/5223 257/459 |

* cited by examiner

*Primary Examiner* — Hung Vu
(74) *Attorney, Agent, or Firm* — Crawford Maunu PLLC

(57) ABSTRACT

A circuit arrangement includes a substrate, an integrated circuit (IC) component attached to the substrate, and one or more round wire segments attached to the substrate. The one or more round wire segments have first and second portions for connecting to the IC component, and each first and second portion has a planar landing area extending longitudinally along the wire. The circuit arrangement further includes bond wires connecting the landing areas to the IC component.

24 Claims, 4 Drawing Sheets

WIRE BONDED IC COMPONENTS TO ROUND WIRE

FIELD OF THE INVENTION

The disclosure describes wire bonding IC components to round wiring on a flexible substrate.

BACKGROUND

There are a number of applications in which electronics are attached to various articles. The electronics may provide a function that is ancillary to the function of the article or may work in conjunction with the article to provide a desired function. Radio frequency identification (RFID), near-field communication, and light-emitting diode (LED) lighting are examples of such applications.

RFID applications vary from inventory control to traffic management to pet identification. RFID systems generally include readers and tags. RFID tags are affixed to the articles to be tracked, and the RFID reader emits a signal to activate the RFID tag. The RFID tag may respond by reading data from a memory and emitting a signal with the desired information for the RFID reader.

LED-based lighting is becoming more popular due in part to the energy efficient qualities and durability of LEDs. Applications for LED-based lighting may include advertising signage, decorations, or utility and general purpose lighting.

For some applications, LEDs or RFID integrated circuits (ICs) and associated wiring are mounted on a flexible substrate such as those made from polyamides or polyimides. Prior to mounting the electronic device, wiring patterns may be formed on the substrate using a print-and-etch process. The wiring patterns are laid out to accommodate placement of one or more devices on the substrate at desired locations.

Making RFID tags or LED arrangements using a polyamide or polyimide substrate may be prohibitively expensive for some applications. The expense is attributable in part to the print-and-etch processes used in creating the wiring pattern. Expensive chemicals are required for print-and-etch processes, and hazardous waste is a byproduct.

SUMMARY

In one embodiment, a circuit arrangement includes a substrate, an integrated circuit (IC) component attached to the substrate, and one or more round wire segments attached to the substrate. The one or more round wire segments have first and second portions for connecting to the IC component, and each first and second portion has a planar landing area extending longitudinally along the wire. The circuit arrangement further includes bond wires connecting the landing areas to the IC component.

In another embodiment, a method of making a circuit arrangement includes attaching one or more round wire segments to a substrate. The one or more round wire segments have first and second portions, and planar landing areas are formed on the first and second portions, respectively. An integrated circuit (IC) component is attached to the substrate, and the planar landing areas are wire bonded to the IC component.

The above summary is not intended to describe each disclosed embodiment. The figures and detailed description that follow provide additional example embodiments.

BRIEF DESCRIPTION OF THE DRAWINGS

Other aspects and advantages will become apparent upon review of the Detailed Description and upon reference to the drawings in which.

DETAILED DESCRIPTION

Figure 1:
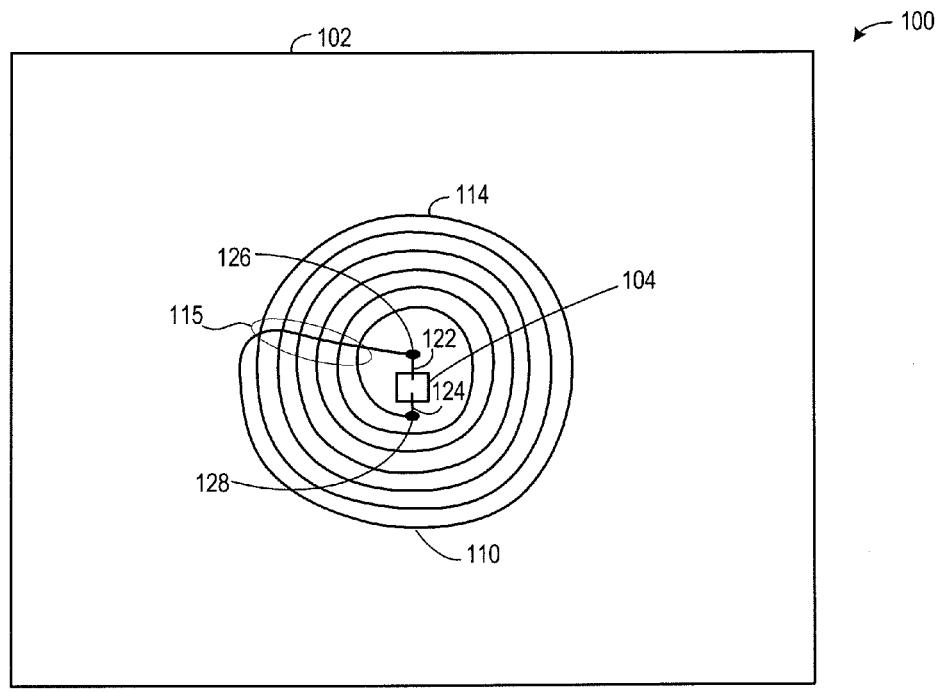
FIG. 1 shows an example of an RF transponder arrangement.

The disclosed structures and methods simplify attachment of wiring to electronic components such as RF transponders and LEDs. In addition, RFID tags and LED-based lighting apparatus may be constructed with low-cost materials and processes, with fewer environmentally hazardous chemicals for manufacture.

Some makers of RFID tags and LED-based lighting apparatus use round wire rather than printed-and-etched patterns of conductive material for wiring the electronic components. "Wire" as used herein does not refer to printed or printed-and-etched patterns of conductive material. Rather, as used herein, wire refers to one or more strands of conductive material that have been made, for example, by drawing the conductive material through draw plates. Using a fine gauge copper wire to make antennas eliminates the use of environmentally hazardous chemicals as would be required for printed-and-etched antennas. However, connecting the wire to an electronic component such as an RF transponder or an LED presents additional challenges.

Automated wire bonding machines may be used to construct wire bonds between the antenna and/or power wiring and the electronic component. With fine gauge wire as the antenna/power wire, the wire bonding machine may have difficulty locating the desired portions of the wiring. Distinguishing a strand of the fine gauge wire from the adhesive that binds the antenna wire to the substrate may be problematic based on imagery gathered by the wire bonding machine. In addition, even if the wire bonding machine is properly positioned, making a wire bond on the fine gauge antenna wire may be problematic. The fine gauge and rounded surface of the wire are not conducive to making a strong joint between the wire and bond wire.

In one implementation, a transponder arrangement includes a substrate and an RF transponder attached to the substrate. One or more segments of round wire are attached to the substrate, and the one or more round wire segments have first and second portions for connecting to the RF transponder. Both the first and second portions have planar landing areas that extend longitudinally along the antenna wire. Bond wires connect the first and second landing areas of the antenna wire to the RF transponder. The planar landing areas contribute to making a structurally sound connection between the bond wires and the round antenna wire. In another aspect, beads of glue may surround the planar landing areas. The beads of glue may provide markers for imagery-based guidance for wire bonding and provide additional stability for portions of the wire segment(s) subjected to wire bonding.

In another implementation, an LED-based lighting apparatus includes a substrate and a plurality of LEDs attached to the substrate. One or more round wire segments are attached to the substrate, and the one or more round wire segments have first and second portions for connecting to each of the LEDs. Both the first and second portions have planar landing areas that extend longitudinally along the one or more round wire segments. Bond wires connect the first and second landing areas to the LEDs. The planar landing areas contribute to making a structurally sound connection between the bond wires and the one or more round power wire segments. In another aspect, beads of glue may surround the planar landing areas. The beads of glue may provide markers for imagery-based guidance for wire bonding and additional stability for portions of the one or more round wire segments subjected to wire bonding.

FIG. 1 shows an example of an RF transponder arrangement 100. The RFID transponder arrangement includes a substrate 102, an RF transponder 104, and coil antenna wire 114. The particular functions of the RF transponder are application dependent. However, in general the transponder modulates and demodulates an RF signal and processes information according to the application. The RF transponder may be packaged or unpackaged according to application requirements. The substrate may be either rigid or flexible, also depending on application requirements. In one implementation, the substrate is a flexible substrate and is one of a polyethylene terephthalate (PET), a polyelectrolyte multilayers (PEMs), paper, a high-density polyethylene, or a vinyl, for example.

Rather than using expensive print-and-etch techniques to make antenna wiring for the RF transponder, wire may be glued to the substrate. The wire may be bare or insulated wire (metal core with an insulating jacket) and made of any material suitable for the application. The antenna wire 114 may be a fine gauge, round (round cross-section), bare wire. For example, 44 gauge (AWG) copper wire has been found to be suitable for some applications. However, different gauges may be suitable for different applications. For an implementation having bare antenna wire, an insulating bridge (not shown) may be disposed between intersecting portions 115 of the antenna wire.

The wire is glued to the surface of the substrate with a polymer adhesive. The adhesive may be pressure sensitive, which keeps the wire in place as the antenna pattern is formed on the substrate. For example, the adhesive may be an adhesive transfer tape. It will be appreciated that other types of adhesives may be suitable for different applications. The RF transponder 104 may be attached to the substrate 102 using the same adhesive as is used for the antenna wire.

Antenna wire 114, which is a single coiled segment, has portions for connecting to bond wires 122 and 124. In the coil antenna pattern, end portions of the antenna wire are used for the wire bond connections. For other antenna patterns, the connection portions may be between the end portions of the antenna wire. The connecting portions of the wire have planar landing areas, as shown in subsequent figures, to which bond wires may be connected. The planar landing areas extend longitudinally (lengthwise) along the antenna wire. Beads 126 and 128 of adhesive surround the connecting portions of the antenna wire. The adhesive used for the beads may be a UV or thermal-curable adhesive or a two-part epoxy. The connecting portions are machined to form the planar landing areas on the antenna wire.

Figure 2:
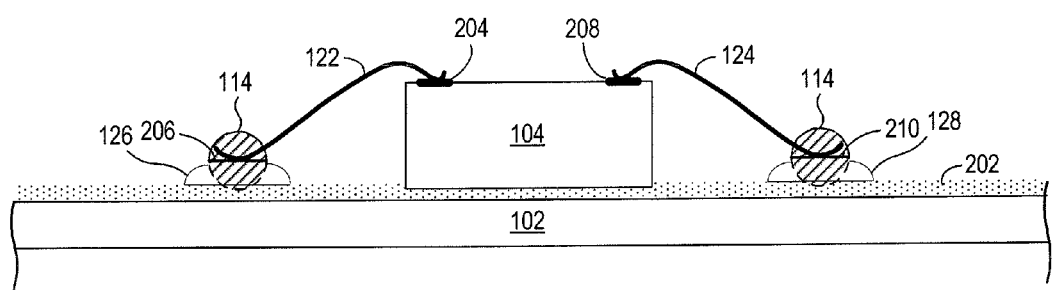
FIG. 2 shows a side view of wire bond connections between the RF transponder and planar landing areas on the antenna wire.

FIG. 2 shows a side view of wire bond connections between the RF transponder 104 and planar landing areas on the antenna wire. The RF transponder 104 and antenna wire 114 are attached to the substrate 102 by adhesive layer 202. The adhesive may be a pressure-sensitive adhesive or some other adhesive that is suitable for the intended application.

Bond wire 122 connects the contact pad 204 of the RF transponder to the planar landing area 206 of the antenna wire, and bond wire 124 connects the contact pad 208 of the RF transponder to the planar landing area 210 of the antenna wire. The bond wires may be wedge bonded to the RF transponder and antenna wire to provide a low profile. In other applications, the bond wires may be ball bonded. In an example implementation, the antenna wire 114 is copper, and the bond wires are either gold or aluminum.

The portions of the antenna wire that connect to the bond wires 122 and 124 are stabilized by beads 126 and 128 of adhesive.

Figure 3:
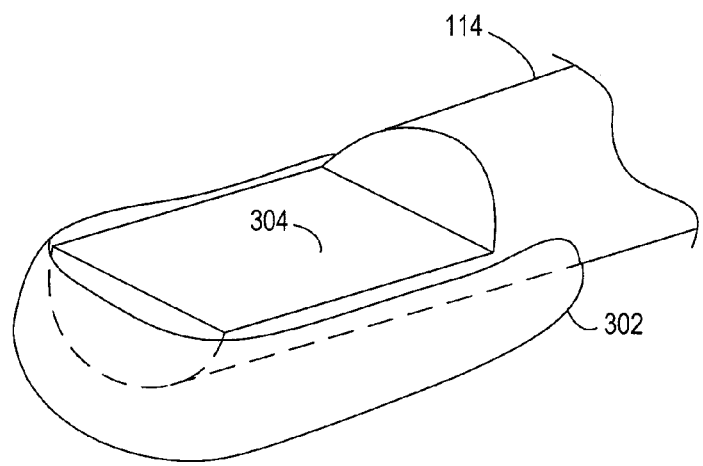
FIG. 3 shows a perspective view of a milled portion of an antenna wire along with a bead of adhesive surrounding the milled portion of the wire.

FIG. 3 shows a perspective view of a machined portion of antenna wire 114 along with a bead 302 of adhesive surrounding the milled portion of the wire. The planar landing area on the wire 114 may be formed by machining the desired portion of the wire. For example, the portion of the wire may be compressed or stamped, milled, or laser ablated. After machining, the planar landing area 304 remains. Each connection portion of the antenna wire may be machined in a similar fashion.

Figure 4:
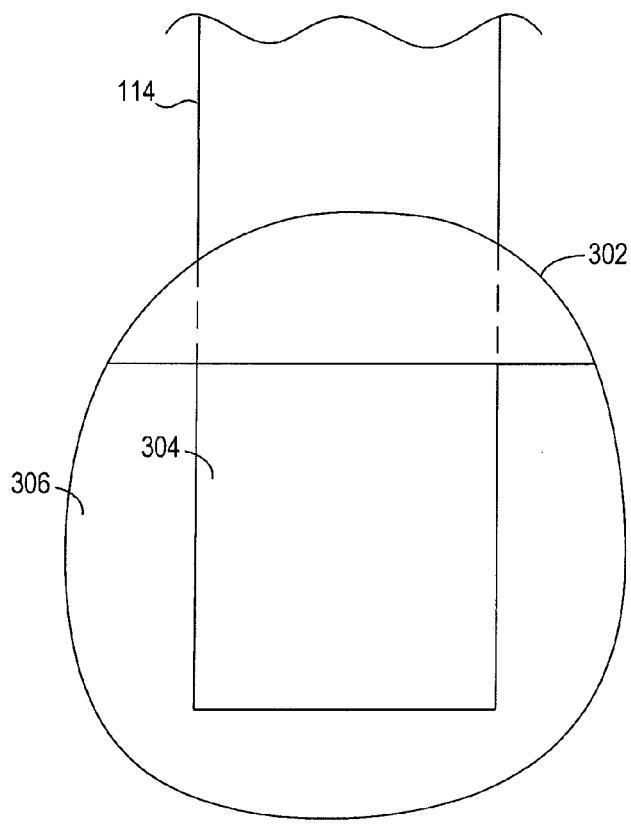
FIG. 4 shows a top view of a milled portion of an antenna wire along with a bead of adhesive surrounding the milled portion of the wire.

FIG. 4 shows a top view of a machined portion of antenna wire 114 along with a bead 302 of adhesive surrounding the milled portion of the wire. The bead of adhesive stabilizes the connection portion of the wire for wire bonding. In addition, the bead of adhesive may provide additional image contrast for imagery-based guidance to a wire bonding machine for accurately locating the bonding site. Specifically, the adhesive bead 302 is contrasted with the adhesive layer (FIG. 2, 202) and with the planar landing area 304 of the wire 114.

Figure 5:
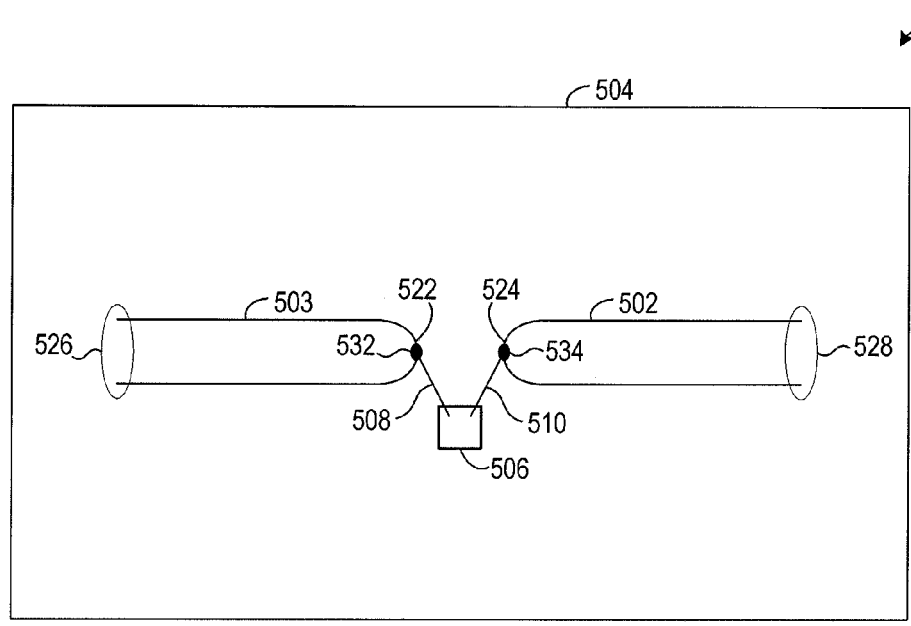
FIG. 5 shows another RF transponder arrangement having antenna wire segments and having the wire bonds at portions of the antenna wire that are between end portions of the antenna wire.

FIG. 5 shows another RF transponder arrangement 500 having antenna wire segments 502 and 503 and having the wire bonds at portions of the antenna wire that are between end portions of the antenna wire. It will be appreciated that in addition to the antenna patterns of FIGS. 1 and 5, the disclosed structures are adaptable for any of the many different antenna patterns known in the art to be suitable for RFID applications. As with the RF transponder arrangement 100 of FIG. 1, RF transponder arrangement 500 includes a substrate 504 and an RF transponder 506. The antenna and RF transponder may be adhered to the substrate as described for the RF transponder arrangement 100.

The bond wires 508 and 510 connect the RF transponder 506 to portions 522 and 524 of the antenna wire that are between the end portions 526 and 528. Beads 532 and 534 of adhesive surround planar landing areas, which are not visible in FIG. 5, at which the bond wires 508 and 510 connect to the antenna wire. The planar landing areas of antenna 502 may be shaped similar to the planar landing area 304 shown in FIG. 3, except that the planar landing area would be bounded on two sides rather than one side by the full breadth of the wire 114, because the planar landing areas of antenna 502 are not at the ends of the wire.

Figure 6:
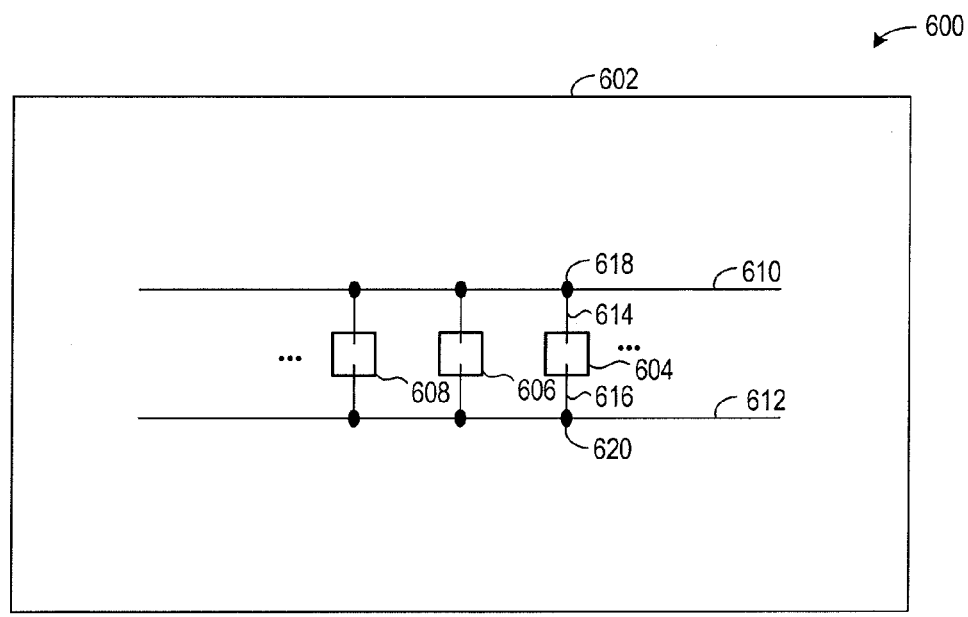
FIG. 6 shows an LED-based lighting arrangement having wire bonds from the LEDs to segments of power wires.

FIG. 6 shows an LED-based lighting arrangement 600 having wire bonds from the LEDs to segments of power wires. The lighting arrangement includes a substrate 602, such as that described above, along with LEDs 604, 606, and 608 and power wires 610 and 612 that are attached to the substrate. Additional control wires (not shown) may be attached to the substrate and connected to the LEDs in a manner similar to the manner in which the power wires are connected to the LEDs.

The type of wire used for the power wires 610 and 612 may be the same as the type of wire used for the antenna wire 114 of FIG. 1. Also, the power wires and LEDs may be attached to the substrate using an adhesive layer as described above for the RF transponder arrangements.

LEDs 604, 606, and 608 are connected to the power wires 610 and 612 by respective pairs of bond wires. For example, bond wires 614 and 616 connect LED 604 to the power wires 610 and 612, respectively. The connections are similar to the connections described above for the RF transponder arrangement 100 and include planar landing areas (not shown) on the wires 610 and 612 and beads 618 and 620 of adhesive that surround the planar landing areas. The planar landing areas of wires 610 and 612 and the adhesive beads 618 and 620 are structurally similar to the structures described above for the RF transponder arrangement 500 of FIG. 5. Though not shown, it will be recognized that current regulating circuits, such as resistors, may be connected between the power wiring and the LEDs.

Figure 7:
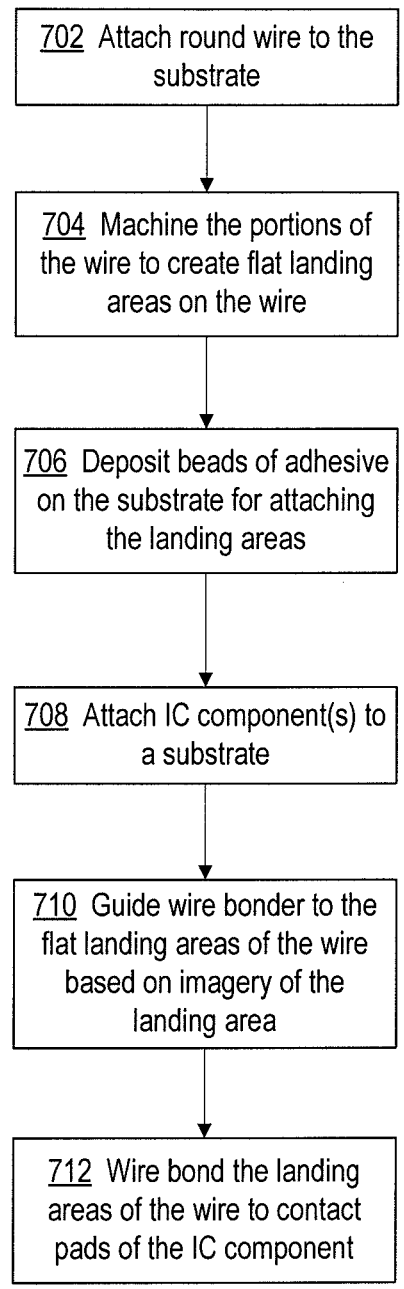
FIG. 7 is a flowchart of a process of making a circuit arrangement having an IC component wire bonded to round wiring on a substrate.

FIG. 7 is a flowchart of a process of making a circuit arrangement having an IC component wire bonded to round wiring on a substrate. One or more round wire segments are attached to the substrate at block 702. The wiring may implement a desired antenna pattern for an RF transponder or power and control wires for LEDs. The type of wire and means for attaching the wire to the substrate may be as described above in regards to the RF transponder arrangement 100 and the LED-based lighting arrangement 600.

The portions of the wire segment(s) at which the bond wires are to be attached are machined at block 704 to form the planar landing areas. The machining may be performed by stamping, compressing, milling, or laser ablating the desired portions of the wire.

Beads of adhesive are deposited on the substrate for attaching the planar landing areas of the wire at block 706. Each bead of adhesive may be deposited using known dispensing or jetting equipment.

At block 708, one or more IC components are attached to a substrate. The IC component may be either an RF transponder or an LED, the component may be attached using an adhesive, and the substrate may be rigid or flexible, all as described above.

The wire bonding head of a wire bonder is guided to the planar landing areas at block 710. The wire bonder may be imagery-based, using images of the wiring to position the wire bonding head at the planar landing areas of the wire on the substrate.

At block 712, the planar landing areas of the wire are wire bonded to contact pads on the IC component. The bond wires may be wedge bonded or ball bonded, depending on application requirements. Though blocks 702-712 are presented in a particular order, it will be recognized that the order of processing may vary according to implementation requirements. For example, the IC component may be attached to the substrate at some part of the process before the portions of the round wire are machined, and portions of the wire may be machined before or after the wire is attached to the substrate.

The present invention is thought to be applicable to a variety of applications. Other aspects and embodiments will be apparent to those skilled in the art from consideration of the specification and practice of the circuits and methods disclosed herein. It is intended that the specification and illustrated embodiments be considered as examples only, with a true scope of the invention being indicated by the following claims.

What is claimed is:

1. A circuit arrangement, comprising:
a substrate;
an integrated circuit (IC) component attached to the substrate;
one or more round wire segments attached to the substrate, the one or more round wire segments having first and second portions for connecting to the IC component, and each of the first and second portions having a respective planar landing area extending longitudinally along the one or more round wire segments;
wherein each of the one or more round wire segments has a round cross section; and
bond wires directly connected to the respective planar landing areas and to the IC component.

2. The circuit arrangement of claim 1, further comprising:
a first bead of adhesive disposed on the substrate and attaching the first portion of the one or more round wire segments to the substrate; and
a second bead of adhesive disposed on the substrate and attaching the second portion of the one or more round wire segments to the substrate.

3. The circuit arrangement of claim 1, wherein the one or more round wire segments is one round wire segment, and the first and second portions are end portions of the one round wire segment.

4. The circuit arrangement of claim 1, wherein the one or more round wire segments includes first and second round wire segments, and the first portion is between end portions of the first round wire segment, and the second portion is between end portions of the second round wire segment.

5. The circuit arrangement of claim 1, wherein each of the one or more round wire segments has a metal core and an electrically insulative jacket surrounding the metal core.

6. The circuit arrangement of claim 1, wherein each of the one or more round wire segments is copper, and the bond wires are one of gold or aluminum.

7. The circuit arrangement of claim 1, further comprising an adhesive that bonds the IC component and the one or more round wire segments to the substrate.

8. The circuit arrangement of claim 7, wherein the adhesive is a pressure sensitive adhesive.

9. The circuit arrangement of claim 1, wherein the IC component is an RF transponder, and the one or more round wire segments form an antenna.

10. The circuit arrangement of claim 1, wherein the IC component is an LED and the one or more round wire segments include power wiring.

11. The circuit arrangement of claim 1, wherein the substrate is a flexible substrate.

12. The circuit arrangement of claim 11, wherein the flexible substrate is one of a polyethylene terephthalate (PET), a polyelectrolyte multilayers (PEMs), paper, a high-density polyethylene, or a vinyl.

13. A method of making a circuit arrangement, comprising:
attaching one or more round wire segments to a substrate, the one or more round wire segments having first and second portions;

wherein each of the one or more round wire segments has a round cross section;

forming planar landing areas on the first and second portions of the one or more round wire segments, respectively;

attaching an integrated circuit (IC) component to the substrate; and wire bonding the planar landing areas to the IC component.

14. The method of claim 13, further comprising:

depositing beads of adhesive on the substrate for attaching the first and second portions of the one or more round wire segments to the substrate.

15. The method of claim 13, wherein each of the one or more round wire segments is one round wire segment, and the first and second portions are end portions of the one round wire segment.

16. The method of claim 13, wherein each of the one or more round wire segments includes first and second round wire segments, and the first portion is between end portions of the first round wire segment, and the second portion is between end portions of the second round wire segment.

17. The method of claim 13, wherein each of the one or more round wire segments has a metal core and an electrically insulative jacket surrounding the metal core.

18. The method of claim 13, wherein each of the one or more round wire segments is copper, and the bond wires are one of gold or aluminum.

19. The method of claim 13, wherein:

the attaching of the IC component to the substrate includes attaching the IC component to the substrate using an adhesive; and the attaching of the one or more round wire segments to the substrate includes attaching the one or more round wire segments to the substrate using the adhesive.

20. The method of claim 19, wherein the adhesive is a pressure sensitive adhesive.

21. The method of claim 13, wherein the IC component is an RF transponder, and the one or more round wire segments form an antenna.

22. The method of claim 13, wherein the IC component is an LED and the one or more round wire segments include power wiring.

23. The method of claim 13, wherein the substrate is a flexible substrate.

24. The method of claim 23, wherein the flexible substrate is one of a polyethylene terephthalate (PET), a polyelectrolyte multilayers (PEMs), paper, a high-density polyethylene, or a vinyl.

* * * * *